United States Patent [19]

Sorrells

[11] Patent Number: 4,761,617
[45] Date of Patent: Aug. 2, 1988

[54] LOW POWER ASTABLE MULTIVIBRATOR

[75] Inventor: Peter H. Sorrells, Phoenix, Ariz.

[73] Assignee: Motorola, Inc., Schaumburg, Ill.

[21] Appl. No.: 65,741

[22] Filed: Jun. 24, 1987

[51] Int. Cl.$^4$ ............................................. H03K 3/281
[52] U.S. Cl. .................................. 331/111; 331/113 R
[58] Field of Search .................. 331/111, 113 R, 144; 307/290, 291; 328/193

[56] References Cited

U.S. PATENT DOCUMENTS 3,971,389 7/1976 Brownlee et al. ............ 331/113 R X
4,205,306 5/1980 Turlej .......................... 331/113 R X

OTHER PUBLICATIONS

Motorola Data Sheet on Dual Timing Circuit, Part No. MC3456.

Motorola Data Sheet on Dual Monostable Multivibrator, Part Nos. MC14548B, MC14528B.

Primary Examiner—Eugene R. LaRoche
Assistant Examiner—David Mis
Attorney, Agent, or Firm—Maurice J. Jones

[57] ABSTRACT

A low power, astable multivibrator which operates on supply voltages as low as 1.5 volts and is suitable for controlling the application of power to power consuming electrical devices in battery-powered applications is disclosed. A transistor circuit which utilizes relatively large resistance values and positive feedback is presented. Resistance values are sufficiently large to bias transistors so that operation of the transistors in their saturation regions would be prevented without the application of the positive feedback.

12 Claims, 1 Drawing Sheet

LOW POWER ASTABLE MULTIVIBRATOR

BACKGROUND OF THE INVENTION

This invention generally relates to an electronic circuit which forms an astable multivibrator. More specifically, the present invention relates to a multivibrator which operates on a relatively low amount of voltage, consumes a relatively low amount of power, and is therefore suitable for use in battery-powered applications.

Multivibrators represent electrical timing circuits which produce pulses having predetermined timing parameters associated therewith. These timing parameters are often controlled through resistance-capacitance elements coupled into the multivibrator circuit. Astable multivibrators, also called free-running multivibrators, represent electrical circuits where one or more multivibrators are configured to operate as an oscillator, or to produce a continuous stream of pulses.

An astable multivibrator may advantageously control power to electrical circuits which perform various electrical functions in a battery-powered system. When these electrical functions accomplish their tasks using less than 100% of the available time, the circuits which perform these electrical functions may be deenergized for that portion of the time in which they are not performing their tasks. For example, sensing, data logging or communication may occur only a small fraction of each second, minute or hour. Accordingly, the circuits which perform such electrical functions may be energized only on a low duty cycle schedule to conserve battery power.

In such battery-powered systems, power consumption of an astable multivibrator represents a critical parameter because the astable multivibrator may remain energized 100% of the time. Only when the astable multivibrator output becomes active, or produces a pulse, will the circuits that perform particular electrical functions become energized so that they may perform their respective functions.

Conventional multivibrator circuits are not well suited for such an application. Typical multivibrator circuits consume excessive amounts of current. This excessive current consumption directly relates to excessive power consumption. Additionally, such circuits typically require an excessive power supply voltage which forces the use of additional battery cells for energization of the multivibrator circuit. In addition, the excessive supply voltage also relates directly to excessive power consumption. Furthermore, such conventional circuits often consume excessive amounts of current during the longer duration portion of the energization duty cycle when power is not applied to the functional circuit. In other words, such circuits often consume more power than is necessary, while the multivibrator output is inactive.

SUMMARY OF THE INVENTION

Accordingly, it is an object of the present invention to provide an improved astable multivibrator which may advantageously be used to control the application of electrical power to a power consuming device in a battery operated electrical system.

Another object of the present invention concerns providing an improved astable multivibrator which utilizes a minimum amount of power.

Yet another object of the present invention concerns providing an improved astable multivibrator which requires minimal power supply voltage.

Still another object of the present invention concerns providing an improved astable multivibrator which minimizes power consumption during an off state portion of the multivibrator's operating cycle.

The above and other objects and advantages of the present invention are carried out in one form by a device which establishes a duration for the multivibrator's off state, a device which controls a duration of the multivibrator's on state, and a device which provides positive feedback to the off state establishing device while the multivibrator experiences its on state. The on state controlling device couples between the output and a first input of the off state establishing device, and the positive feedback providing device couples between the output and a second input of the off state duration establishing device.

BRIEF DESCRIPTION OF THE DRAWINGS

A more complete understanding of the present invention may be derived by referring to the detailed description and claims when considered in connection with the accompanying drawings, wherein like reference numbers throughout the drawings indicate similar features and wherein:

DETAILED DESCRIPTION OF THE PREFERRED EMBODIMENT

Figure 1:
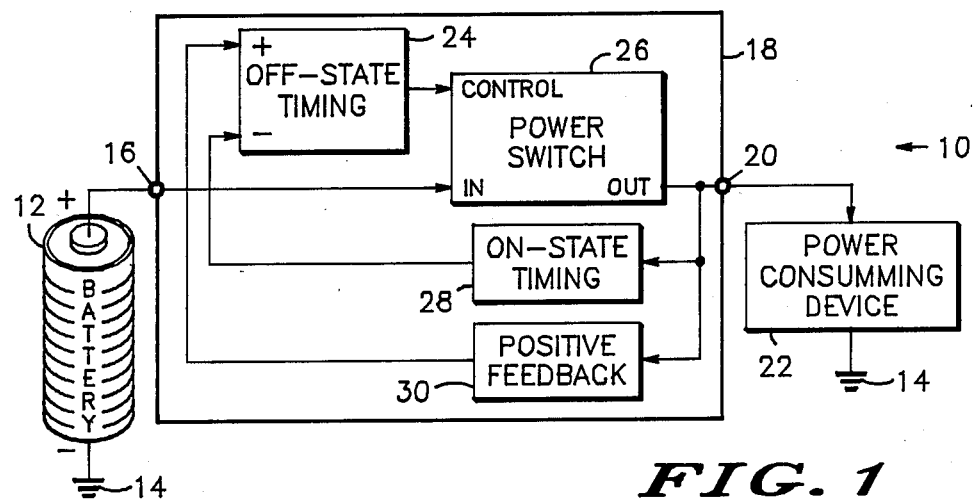
FIG. 1 shows a block diagram of a battery-powered system which uses an astable multivibrator to control power applied to a power consuming device.

FIG. 1 shows a block diagram of a battery-powered system 10. In battery-powered system 10, a battery 12 couples at a negative terminal thereof to a terminal 14 which is adapted to receive a common potential or ground. A positive terminal of battery 12 couples to an input node 16 of an astable multivibrator 18. An output node 20 of astable multivibrator 18 couples to a power supply input of a power consuming device 22, and a ground node of power consuming device 22 couples to ground terminal 14.

Astable multivibrator 18 establishes the power energization duty cycle for power consuming device 22. Thus, in a single operating cycle astable multivibrator 18 exhibits two states. In an "on state", power is routed from battery 16 through astable multivibrator 18 to power consuming device 22. However, in an "off state" no power is applied to power consuming device 22. The operating cycle repeats continuously. Astable multivibrator 18 further represents a timing device which controls how often and for how long power is applied to power consuming device 22. For example, astable multivibrator 18 may establish a 10% duty cycle by applying power to power consuming device 22 for 100 milliseconds out of each second.

In the present invention, power consuming device 22 may represent a wide variety of electrical circuits which perform a wide variety of electrical functions. These electrical functions may dictate the timing requirements established by astable multivibrator 18. For example, power consuming device 22 may represent a sensing device which senses temperature, sound or light in an external environment in which battery-powered system 10 operates. Such sensing need not occur on a continuous basis when the temperature, sound level or light intensity varies slowly. Accordingly, power from battery 12 may be conserved by denergizing power consuming device 22 whenever such sensing is not required. Those skilled in the art will recognize that power consuming device 22 may alternatively represent a computer, transmitter, receiver, or other electrical circuits.

Within astable multivibrator 18, power input node 16 couples to an input port of a power switch 26. An output port of power switch 26 couples to output node 20, an input of an on-state timing device 28 and an input of a positive feedback providing device 30. An output of on-state timing device 28 couples to a minus control input of an off-state timing device 24, and an output of positive feedback providing device 30 couples to a plus input of off-state timing device 24. An output of off-state timing device 24 couples to a control node of power switch 26.

Off-state timing device 24 establishes the duration of the off state for astable multivibrator 18. Off-state timing device 24 remains inactive during the off state but activates during the on state to control power switch 26 so that battery power is supplied to output node 20 of astable multivibrator 18. On-state timing device 28 controls the duration of the on state for multivibrator 18.

On-state timing device 28 and positive feedback providing device 30 both provide feedback to off-state timing device 24. Feedback represents the returning of a portion of an output signal back to an input. Negative feedback occurs when the application of the feedback signal tends to cause a reduction, reversal of directions, or a change in states of the output signal. Positive feedback occurs when the feedback signal tends to reinforce the output signal, increase the output signal, or maintain the current direction or state of the output signal. Thus, in astable multivibrator 18, positive feedback providing device 30 provides positive feedback during the on state of astable multivibrator 18, and this positive feedback tends to reinforce or maintain astable multivibrator 18 in the on state. On the other hand, on-state timing device 28 provides negative feedback which tends to cause astable multivibrator to change operation from the on state to the off state.

Figure 2:
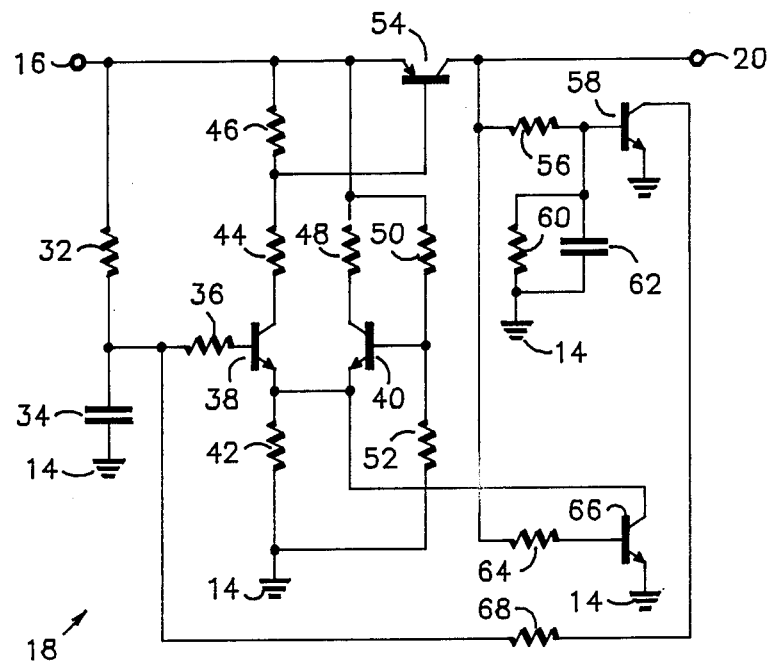
FIG. 2 shows a schematic of the astable multivibrator from FIG. 1.

FIG. 2 shows a schematic diagram of a circuit which implements astable multivibrator 18 as shown in FIG. 1. Thus, battery power is applied at input node 16 in astable multivibrator 18. Node 16 couples to first nodes of resistors 32, 46, 48 and 50, and to an input port or emitter node of a power switching device such as PNP transistor 54. A second node of resistor 32 couples to a first node of a capacitor 34, a first node of a resistor 36 and a first node of a resistor 68. A second node of capacitor 34 couples to ground terminal 14. A second node of resistor 36 couples to a control or base node of a switching device such as NPN transistor 38, a collector node of transistor 38 couples to a first node of a resistor 44, and a second node of resistor 44 couples to a second node of resistor 46 and to a base node of transistor 54. An emitter node of transistor 38 couples to an emitter node of an NPN transistor 40, a first node of a resistor 42 and an output or a collector node of a switching device such as NPN transistor 66. A second node of resistor 42 couples to ground terminal 14 and a first node of a resistor 52. A second node of resistor 52 couples to a second node of resistor 50 and to a base node of transistor 40.

A collector node of transistor 54 couples to output node 20 of astable multivibrator 18, to a first node of a resistor 56, and a first node of a resistor 64. A second node of resistor 64 couples to a base node of transistor 66, and an emitter node of transistor 66 couples to ground terminal 14. A second node of resistor 56 couples to a control or base node of a switching device such as NPN transistor 58, to a first node of a capacitor 62, and a first node of a resistor 60. A second node of capacitor 62, a second node of resistor 60, and an emitter node of transistor 58 couple to ground terminal 14. A collector node of transistor 58 couples to a second node of resistor 68.

In the FIG. 2 schematic, battery power is applied at terminal 16 100% of the time during the operation of battery-powered system 10 (see FIG. 1). Resistor 32, capacitor 34, resistor 36, transistor 38, transistor 40, resistor 42, resistor 44, resistor 48, resistor 50 and resistor 52 operate together to establish the off-state duration of the operating cycle of multivibrator 18 and represent off-state timing device 24 from FIG. 1. Resistors 50 and 52 couple in series between terminal 16 and ground terminal 14 to supply a stable voltage to the base of transistor 40 at the connection between resistors 50 and 52. Transistor 40 in connection with resistors 50 and 52 sets a "raised" threshold voltage at the emitter of transistor 40. This raised threshold voltage is represented by the stable voltage supplied between resistors 50 and 52 minus $V_{be}$ for transistor 40. Transistors 40 and 38 couple together in a differential amplifier configuration, and resistor 42 provides a path to ground for current from the emitters of transistors 38 and 40.

Capacitor 34 in connection with resistor 32 generate a voltage that changes with time due to the charging and discharging of capacitor 34. Transistor 38 and resistor 36 compare the raised threshold voltage provided at the emitter of transister 40 with this voltage that changes with time and is provided at the coupling between capacitor 34 and resistor 32. If this voltage that changes with time is less than the threshold voltage plus $V_{be}$ for transistor 38, then transistor 38 remains deactivated and multivibrator 18 exhibits its off state.

The charging of capacitor 34 will eventually generate a voltage at resistor 36 which equals $V_{be}$ for transistor 38 plus the raised threshold voltage. At this point, transistor 38 partially activates, or begins to conduct current, into the collector of transistor 38 and through resistors 44 and 46.

Resistor 46 in connection with transistor 54 represents power switch 26 from FIG. 1. As current flowing into the collector of transistor 38 increases, current through resistor 46 eventually becomes great enough to cause a voltage drop across resistor 46 which equals $V_{be}$ for transistor 54. When this happens, transistor 54 begins to conduct current or partially activate.

Resistor 64 and transistor 66 represent positive feedback providing device 30 from FIG. 1. Thus, positive feedback is provided to transistor 38 at the emitter of transistor 38. As transistor 54 begins to conduct current at its collector, current begins to flow into the base of transistor 66. Consequently, transistor 66 begins to conduct current or partially activate. As transistor 66 begins to conduct current, it provides positive feedback to transistor 38 by lowering the raised threshold voltage provided at the emitter of transistor 38. In other words, the impedance between the emitter of transistor 38 and ground terminal 14 decreases as transistor 66 becomes partially activated. This decreasing of impedance at the emitter of transistor 38 causes current flowing into the collector of transistor 38 to increase. This increase in the activiation of transistor 38 in turn causes transistor 54 to conduct a qreater amount of current which in turn causes transistor 66 to conduct a greater amount of current. This positive feedback process of causing transistors 38, 54 and 66 to conduct more and more current continues until transistors 38, 54 and 66 operate in their saturation regions, or become fully activated.

Resistors 56, 60 and 68, capacitor 62 and transistor 58 together represent on-state timing device 28 from FIG. 1. Negative feedback provided to transistor 38 through resistor 68 and transistor 58 eventually causes multivibrator 18 to enter its off state. Upon entering the on state, current flows through transistor 54 and resistor 56 to begin charging capacitor 62. Accordingly, resistor 56 and capacitor 62 represent a second generator of a voltage that changes with time. Transistor 58 represents a second device which compares this second voltage that changes with time to a second predetermined threshold. The threshold used for comparison by transistor 58 is $V_{be}$ of transistor 58 and is set by connecting the emitter of transistor 58 to ground. As current flows through transistor 54 and causes capacitor 62 to charge, capacitor 62 eventually generates a voltage which causes transistor 58 to begin conducting current, or partially activate.

As transistor 58 begins conducting current, negative feedback is provided to transistor 38 by discharging capacitor 34 through resistor 68. The discharging of capacitor 34 tends to cause transistor 38 to reverse states and deactivate. However, since the threshold voltage at the emitter of transistor 38 has been lowered through the application of positive feedback from transistor 66, transistor 38 does not deactivate until capacitor 34 discharges to below a "lowered" threshold voltage. This lowered threshold voltage is established by $V_{ce}$ saturation for transistor 66 and $V_{be}$ for transistor 38. Thus, transistor 54 remains active, multivibrator 18 remains in the on state, and capacitor 62 continues to charge causing transistor 58 to fully activate.

Resistor 68 protects transistor 58 from excessive amounts of current available from capacitor 34. However, resistor 68 exhibits as low of a resistance value as possible to permit a rapid discharge of capacitor 34. When capacitor 34 discharges to approximately the lowered threshold voltage, transistor 38 begins to deactivate. The deactivation of transistor 38 causes current to cease flowing in resistor 46 and therefore causes transistor 54 to begin to deactivate. The deactivation of transistor 54 causes current to stop flowing into the base of transistor 66, and therefore transistor 66 begins to deactivate. The deactivation of transistor 66 then raises the threshold at the emitter of transistor 38, which further deactivates transistor 38. This process continues until transistors 38, 54 and 66 become fully deactivated. As transistor 54 becomes fully deactivated, multivibrator 18 enters its off state. During the off state capacitor 34 again charges until it generates a voltage which approximately equals the raised threshold voltage supplied by transistor 40 and $V_{be}$ of transistor 38 at which time the on state will again be entered. During the off state, capacitor 62 discharges through resistor 60. Astable multivibrator 18 then continues to alternate between on and off states, as described above.

Accordingly, multivibrator 18 represents a circuit which may be used to control the application of electrical power to a power consuming device in a battery-powered electrical system 10 (see FIG. 1). Additionally, multivibrator 18 consumes a minimum amount of power. As discussed above, each of transistors 38, 54, 58 and 66 remain deactivated during the off state of operation. Thus, power consumption is minimized during the off state. Additionally, the use of positive feedback from transistor 66 permits biasing transistors 38, 54 and 58 with relatively large resistance values (discussed below) in a current starved manner which would otherwise prevent conventional switching transistor operation. Specifically, resistor 36 is sufficiently large to prevent transistor 38 from operating in its saturation region without the application of positive feedback from transistor 66. Thus, without the application of this positive feedback, transistor 54 would not fully activate. Consequently, power is conserved through the use of bias resistors exhibiting such large resistance values that they tend to prevent full activation of transistor 54. This causes a reduction in current consumption which directly relates to a reduction in power consumption. On the other hand, the difficulty in fully activating transistor 54 is compensated for by the positive feedback provided through transistor 66.

More specifically, the preferred embodiment utilizes the following component values or component designations for multivibrator 18:

| Component | Value of Designation |
| --- | --- |
| Resistor 32 | 2.2 M |
| Capacitor 34 | 1 Microfarad |
| Resistor 36 | 4.7 M |
| Transistor 38 | 2N2222 |
| Transistor 40 | 2N2222 |
| Resistor 42 | 470K |
| Resistor 44 | 470K |
| Resistor 46 | 1.1 M |
| Resistor 48 | 1.1 M |
| Resistor 50 | 1.1 M |
| Resistor 52 | 1.1 M |
| Transistor 54 | 2N2907 |
| Resistor 56 | 2.2 M |
| Transistor 58 | 2N2222 |
| Resistor 60 | 2.2 M |
| Capacitor 62 | 0.22 Microfarads |
| Resistor 64 | 2.2 M |
| Transistor 66 | 2N2222 |
| Resistor 68 | 10K |

Additionally, multivibrator 18 as described above utilizes ceramic capacitors and metal film resistors for low temperature variation. With the application of 3 volts DC between terminals 14 and 16, multivibrator 18 exhibits an on state of approximately 0.128 seconds and an off state of approximately 1.5 seconds. Furthermore, utilizing the components discussed above, multivibrator 18 draws an average of 6 microamperes over a wide variation in temperature. Additionally, multivibrator 18 may operate on a relatively low voltage. Although the preferred embodiment operates using 3 volts between terminals 16 and 14, multivibrator 18 reliably operates when approximately 1.5 volts are applied between terminals 16 and 14. The limiting factor in establishing the minimum supply voltage is that the $V_{ce}$ saturation voltage for transistor 66 and $V_{be}$ for transistor 38 must be less than the raised threshold voltage which is established by transistor 40, and resistors 50 and 52. The present invention is described above with reference to a particular embodiment which facilitates teaching the invention. Those skilled in the art will recognize that many alternative embodiments also fall within the scope of the present invention. For example, various voltage polarities and transistor polarities may be easily reversed by those skilled in the art. Additionally, those skilled in the art will recognize that alternative active devices such as FETs could replace the transistors in multivibrator 18. Furthermore, the values and component designations listed above may experience wide variation without departing from the scope of the present invention. These and other changes and modifications to the above-described preferred embodiment which are obvious to those skilled in the art are intended to be included within the scope of the present invention.

I claim:

1. An astable multivibrator comprising:
   means, having first and second inputs and an output, for establishing a duration of a multivibrator off state;
   means, having an input coupled to the output of said establishing means and having an output coupled to the first input of said establishing means, for controlling a duration of a multivibrator on state;
   means, having an input coupled to the output of said establishing means and having an output coupled to the second input of said establishing means, for providing positive feedback to said establishing means during the multivibrator on state.

2. A multivibrator as claimed in claim 1 additionally comprising means for switching power having a control node coupled to the output of said establishing means and an output port coupled to the input of said positive feedback providing means and to said controlling means.

3. A multivibrator as claimed in claim 2 wherein said establishing means comprises:
   means for setting a threshold voltage;
   means for generating a voltage that changes with time and;
   means, coupled to said setting means and to said generating means, for comparing the voltage that changes with time to the threshold voltage.

4. A multivibrator as claimed in claim 3 wherein said comparing means comprises:
   a transistor having a base node; and
   means, coupled to said transistor base node and said generating means, for limiting current into the base node of said transistor so that said transistor is prevented from operating in a saturated region without positive feedback from said positive feedback providing means.

5. A multivibrator as claimed in claim 4 wherein said transistor additionally includes an emitter node that couples to the output of said positive feedback providing means, and the output of said controlling means couples to said generating means.

6. A multivibrator as claimed in claim 5 wherein said positive feedback providing means comprises a second transistor having a base node coupled to the output port of said power switching means, a collector node coupled to the emitter node of said transistor, and an emitter node coupled to a terminal adapted to receive a common potential.

7. A multivibrator as claimed in claim 5 wherein said controlling means comprises:
   a second means, coupled to the output port of said power switching means, for generating a voltage that changes with time; and
   a second transistor having a base node coupled to said second generating means, an emitter node coupled to a terminal adapted to receive a common potential, and a collector node coupled to said generating means.

8. A multivibrator as claimed in claim 5 wherein said means for setting a first threshold voltage comprises:
   means for supplying a stable voltage; and
   a second transistor having a base node coupled to said supplying means and an emitter node coupled to the emitter node of said transistor.

9. A method of establishing a duty cycle for a power consuming device, the method comprising the steps of:
   establishing a duration for an off state;
   partially activating a first switching device at the expiration of the off state duration;
   partially activating a power switching device by said first switching device activating step;
   partially activating a positive feedback providing device by said power switching device activating step; and
   fully activating the first switching device by said positive feedback providing device activating step.

10. A method as claimed in claim 9 additionally comprising the steps of:
    establishing a duration for an on state by operation of said power switching device activating step; and
    activating a second switching device at the expiration of the on state duration.

11. A method as claimed in claim 10 additionally comprising the steps of:
    deactivating the first switching device by said second switching device activating step;
    deactivating the power switching device by said first switching device deactivating step; and
    deactivating the second switching device and the positive feedack providing device by said power switching device deactivating step.

12. An astable multivibrator for controlling a duty cycle of a power consumming device, said multivibrator comprising:
    means for supplying a first predetermined threshold voltage;
    first means for generating a first voltage that changes with time;
    means, having first and second inputs coupled to said supplying means and to said generating means, respectively, and having an output, for comparing the first threshold voltage to the voltage that changes with time;
    means for switching power having a control node coupled to the output of said comparing means and having an output port;
    second means, coupled to said power switching means output port, for generating a voltage that changes with time;
    second means, having an input coupled to said second generating means and having an output coupled to said first generating means, for comparing the second voltage that changes with time with a second predetermined threshold; and
    means, having an input coupled to the output port of said power switching means and having an output coupled to the first input of said comparing means, for providing positive feedback to said comparing means.

* * * * *